(12) United States Patent
Zhang et al.

(10) Patent No.: US 12,366,614 B2
(45) Date of Patent: Jul. 22, 2025

(54) HORIZONTAL HALL DEVICE AND PREPARATION METHOD

(71) Applicant: SOUTHEAST UNIVERSITY, Nanjing (CN)

(72) Inventors: Long Zhang, Nanjing (CN); Weifeng Sun, Nanjing (CN); Siyang Liu, Nanjing (CN); Guiqiang Zheng, Nanjing (CN); Yichen Li, Nanjing (CN); Xueqi Li, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 18/849,562

(22) PCT Filed: Mar. 18, 2024

(86) PCT No.: PCT/CN2024/082084
§ 371 (c)(1),
(2) Date: Sep. 23, 2024

(87) PCT Pub. No.: WO2025/102568
PCT Pub. Date: May 22, 2025

(65) Prior Publication Data
US 2025/0155525 A1 May 15, 2025

(30) Foreign Application Priority Data
Nov. 15, 2023 (CN) .......................... 202311520494.1

(51) Int. Cl.
*G01R 33/00* (2006.01)
*G01R 33/07* (2006.01)
(Continued)

(52) U.S. Cl.
CPC ....... *G01R 33/0052* (2013.01); *G01R 33/072* (2013.01); *H01L 21/76224* (2013.01); *H10N 52/01* (2023.02); *H10N 52/80* (2023.02)

(58) Field of Classification Search
CPC ............. G01R 33/0052; G01R 33/072; H01L 21/76224; H10N 52/01; H10N 52/80
See application file for complete search history.

(56) References Cited

U.S. PATENT DOCUMENTS

| 10,050,082 B1 | 8/2018 | Liu et al. |
| 2001/0001494 A1* | 5/2001 | Kocon ................. H10D 62/111 257/E29.04 |

(Continued)

FOREIGN PATENT DOCUMENTS

| CN | 102790072 A | 11/2012 |
| CN | 104898074 A | 9/2015 |

(Continued)

*Primary Examiner* — Dominic E Hawkins
(74) *Attorney, Agent, or Firm* — Bayramoglu Law Offices LLC

(57) ABSTRACT

A horizontal Hall device includes a substrate layer and a BOX layer arranged on the substrate layer, where an epitaxial layer is arranged on the BOX layer, a well layer is arranged on the epitaxial layer, an STI layer is arranged on the well layer, a pair of induction electrodes and a pair of bias electrodes are arranged on the STI layer, ground electrodes are arranged on the epitaxial layer, and current barrier layers are arranged between the induction electrodes and the adjacent bias electrodes.

13 Claims, 9 Drawing Sheets

(51) Int. Cl.
*H01L 21/762* (2006.01)
*H10N 52/01* (2023.01)
*H10N 52/80* (2023.01)

(56) References Cited

U.S. PATENT DOCUMENTS

2015/0129925 A1* 5/2015 Kondo ................ H10D 12/211
 257/105
2022/0020814 A1* 1/2022 Schmidt ............ H01L 21/76877
2022/0173136 A1* 6/2022 Stefanov ............. H01L 23/5223

FOREIGN PATENT DOCUMENTS

| CN | 208297701 U | 12/2018 |
| CN | 113178519 A | 7/2021 |
| CN | 117460396 A | 1/2024 |

\* cited by examiner

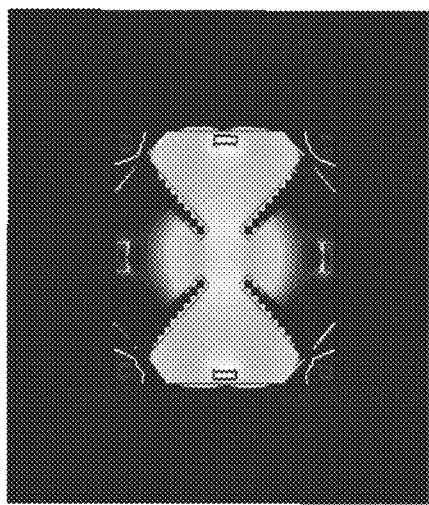 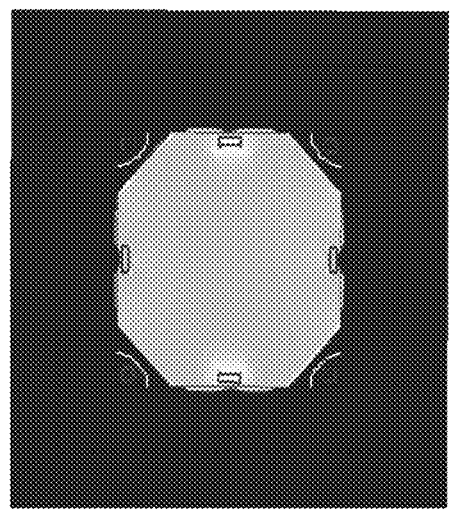 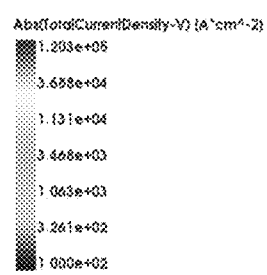
FIG. 4A        FIG. 4B

HORIZONTAL HALL DEVICE AND PREPARATION METHOD

CROSS REFERENCE TO THE RELATED APPLICATIONS

This application is the national phase entry of International Application No. PCT/CN2024/082084, filed on Mar. 18, 2024, which is based upon and claims priority to Chinese Patent Application No. 202311520494.1, filed on Nov. 15, 2023, the entire contents of which are incorporated herein by reference.

TECHNICAL FIELD

The invention relates to the technical field of integrated circuit design, and particularly relates to a horizontal Hall device applied to a Hall sensor and a preparation method.

BACKGROUND

At present, CMOS Hall sensors, as one type of magnetic sensors, are widely applied to automotive electronics, medical electronics, consumer electronics and other fields because of their process compatibility, low cost, high integrity and other advantages. The Hall sensor mainly includes a Hal device and a corresponding signal conditioning circuit. Especially, the Hall sensor for three-dimensional magnetic field detection includes a horizontal Hall device used for detecting a magnetic field perpendicular to the surface of a chip and a vertical Hall device used for detecting a magnetic field parallel to the surface of the chip. The Hall device converts magnetic field signals into electric signals, and the signal conversion efficiency and signal quality determine the overall performance of the Hall sensor. Therefore, high-performance Hall devices are very important for Hall sensors.

For traditional Hall devices, there are the following problems in performance improvement. First, part of the current entering the device will flow out of the device via an induction electrode along the edge of the device, that is, a "short-circuiting" will occur, and this part of current flows along the edge of the device and will not contribute to Hall voltage signal, thus reducing the sensitivity of the device. Patent Application Publication No. CN208297701U provides a horizontal Hall sensor, which, compared with traditional Hall devices, adds a P+ implanted layer to an N-well. Although the use of a PN junction structure restrains "short-circuiting", part of the current will still flow towards the induction electrode along a relatively short current path, thus reducing the sensitivity of the device. Second, the structure of traditional Hall devices determines that the sensitivity of the Hall devices will be restrained by the electrode size, a small electrode size can improve the sensitivity, but it will also bring a challenge in the process and increase the initial offset, indicating that a high sensitivity and a low offset cannot be obtained at the same time due to the limitation of the electrode size. Third, the surface parasitic effect generated by defects and foreign particles on the interface leads to 1/f noise of the Hall device, compromising the signal to noise ratio of the Hall device. In addition, in a CMOS integrated Hall device, Hall devices and an external circuit are integrated on a wafer, causing severe crosstalk between the devices. Although the junction isolation technique can reduce crosstalk, it will introduce a nonlinear resistance, leading to an increase in the residual offset, and the junction isolation area is large, leading to an increase in the chip cost.

An integrated Hall device disclosed by Application Publication No. CN102790072A adopts the junction isolation technique to form an isolation ring in a P-type doped region around an N-well to isolate crosstalk between a substrate and other devices. However, the use of the PN junction structure increases the nonlinear resistance and the residual offset, enlarges the chip area occupied by the Hall device and increases the cost.

SUMMARY

To overcome the defects in the prior art, the objective of the invention is to provide a horizontal Hall device and a preparation method, which use a deep trench isolation (DTI) structure and a shallow trench isolation (STI) structure to control the current path to avoid short-circuiting, reduce surface noise, and improve the sensitivity of the Hall device and prevent the sensitivity of the Hall device from being restrained by the electrode size, such that the electrode size can be increased to reduce the offset, and the sensitivity remains unchanged or even is improved. A full isolation structure is used to completely isolate sensing devices from other devices, thus avoiding crosstalk from other devices.

To fulfill the above objective, the invention provides a horizontal Hall device, including: a substrate layer of a first conduction type, a buried oxide (BOX) layer being arranged on the substrate layer of the first conduction type, an epitaxial layer of the first conduction type being arranged on the BOX layer, a well layer of a second conduction type being arranged on the epitaxial layer of the first conduction type, an STI layer being arranged on the well layer of the second conduction type, a pair of induction electrodes of the second conduction type and a pair of bias electrodes of the second conduction type being arranged on the STI layer, the pair of induction electrodes of the second conduction type and the pair of bias electrodes of the second conduction type being as deep as the well layer of the second conduction type, ground electrodes being connected to the epitaxial layer of the first conduction type, wherein current barrier layers are arranged between the induction electrodes of the second conduction type and the adjacent bias electrodes of the second conduction type, and the current barrier layers from the STI layer pass through the well layer of the second conduction type and the epitaxial layer of the first conduction type to be in contact with the BOX layer.

To fulfill the above objective, the invention further provides a preparation method for a horizontal Hall device, including the following steps:

preparing a substrate with a BOX layer and an epitaxial layer, wherein the epitaxial layer is of a first conduction type, and the substrate is of the first conduction type;

performing deep trench etching on the epitaxial layer of the first conduction type to form deep trenches, which are located in the BOX layer and have bottoms in direct contact with the BOX layer, and depositing silicon dioxide to fill in the deep trenches to form current barrier layers;

forming, by lithography, a doping window uncovered with a photoresist, covering the current barrier layers with the photoresist, and doping a top of the epitaxial layer of the first conduction type to form a well layer of a second conduction type;

performing shallow trench etching on the well layer of the second conduction type except the current barrier layers, induction electrode pair regions and bias electrode pair regions to form a shallow trench located in the well layer of the second conduction type, and depositing silicon dioxide to form an STI layer; and doping the induction electrode pair regions and the bias electrode pair regions to form heavily doped contact layers of the second conduction type, and doping the epitaxial layer of the first conduction type to form contact layers of the first conduction type.

Compared with the prior art, the invention has the following advantages:

(1) The invention adopts current barrier layers and especially adopts DTI structures, thus improving the sensitivity of the device and restraining "short-circuiting". Because current tends to flow along a short current path (a low-resistance direction), part of the current entering a traditional Hall device will flow out of the device via an induction electrode along the edge of the device, leading to "short-circuiting". The part of current causing "short-circuiting" will not generate an effective Hall voltage under the action of magnetic field force during operation of the Hall device, thus reducing the magnetic field induction sensitivity of the Hall device. According to the Hall device provided by the invention, the current barrier layers (the DTI structures) are used to change the resistance distribution in the device to turn an original low-resistance current path into a high-resistance path so as to prevent the current from flowing along the short current path, thus restraining "short-circuiting"; in addition, this part of current will generate a Hall voltage in a direction perpendicular to the current flow direction under the action of magnetic field force, thus improving the sensitivity of the device and avoiding "short-circuiting" that restrains the improvement of the sensitivity of the Hall device.

(2) The invention eliminates the restraint of the electrode size on the sensitivity of the Hall device and can increase the electrode size to reduce the offset without compromising the sensitivity of the device. The sensitivity of the traditional Hall device is in direct proportion to the geometric factor of the Hall device, and the geometric factor is in inverse proportion to the electrode size, so a high sensitivity can be obtained when the electrode size is small. However, due to the influence of factors such as process accuracy and fluctuations, it is difficult to guarantee a symmetric distribution of electrodes with the decrease in the electrode size; the asymmetry of electrodes will lead to an increase in the initial offset of the device, thus compromising the resolution of the Hall device. Therefore, limited by the electrode size, a high sensitivity and a low offset of the traditional Hall device cannot be obtained at the same time. In view of this, the horizontal Hall device provided by the invention adopts DTI structures to control the current path to ensure that the sensitivity of the Hall device will not be retrained anymore by the factors in the traditional theory and can be controlled by adjusting the length of the DTI structures, such that the influence of the electrode size on the sensitivity of the device is avoided, and the electrode size can be increased to reduce the offset without compromising the sensitivity of the device.

(3) The sensitivity of the device is improved. For a horizontal Hall device, a shallow active region N-well can achieve a high sensitivity. According to the horizontal Hall device provided by the invention, the depth-controllable STI structure on the surface of the device equivalently decreases the depth of the active region N-well, thus improving the sensitivity of the device. In addition, "short-circuiting" is overcome, such that the sensitivity of the device is greatly improved (4) A full isolation structure is realized. Different from a PN junction isolation structure adopted by the traditional Hall device, the horizontal Hall device provided by the invention realizes a full isolation structure by means of the DTI structures and the BOX layer. On one hand, the junction field effect introduced by PN junctions on the edge of the traditional Hall device will reduce the symmetry of the Hall device, thus increasing the offset, while the horizontal Hall device provided by the invention adopts a trench isolation structure to ensure that to avoid the junction field effect on the edge of the device, thus reducing the initial offset of the device.

On the other hand, the horizontal Hall device provided by the invention is completely isolated from the other regions to isolate substrate noise and crosstalk from other devices, such that the Hall device can operate normally without being affected by signal crosstalk from other devices after being integrated with an external circuit, and the operating stability of the Hall device is improved.

BRIEF DESCRIPTION OF THE DRAWINGS

Accompanying drawings are provided to gain a further understanding of the invention and explain the invention together with embodiments of the invention, and the accompanying drawings should not be construed as limitations of the invention:

FIGS. 4A-4B illustrate schematic diagrams of current density distributions of the horizontal Hall device in FIG. 1 according to the invention and a traditional Hall device, from an overhead view;

Figure 1:
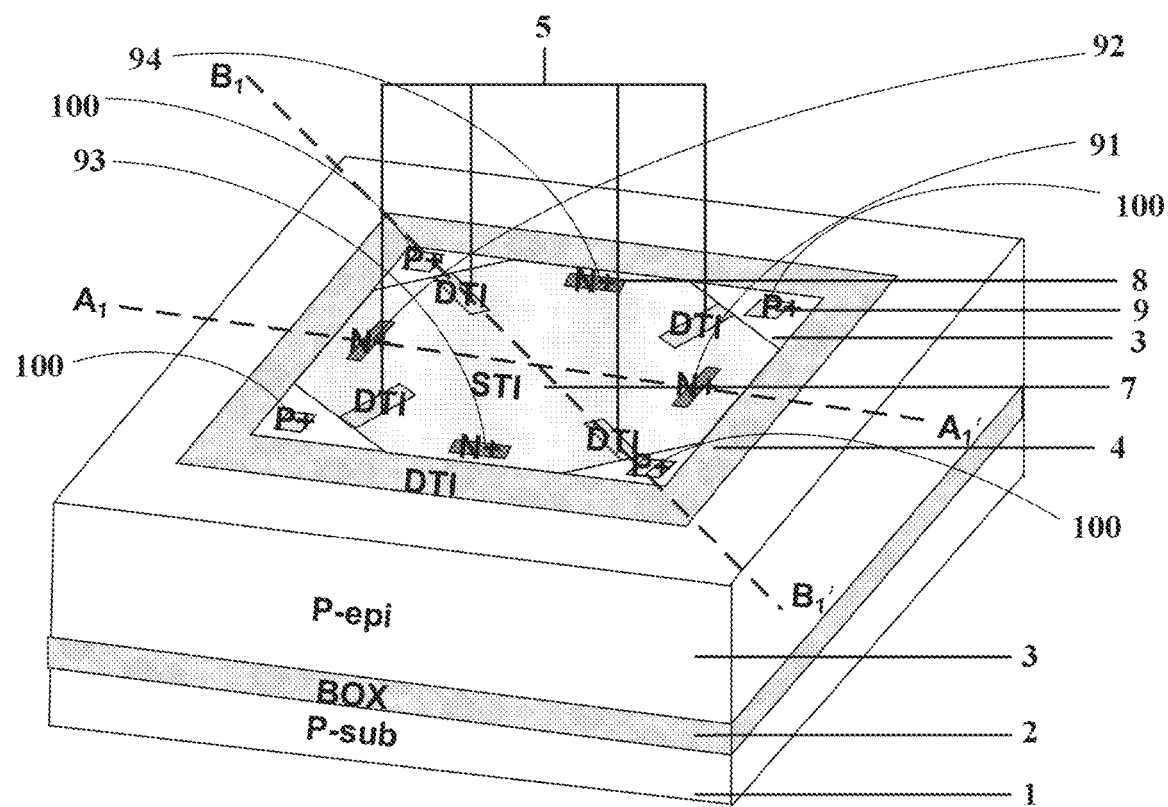
FIG. 1 is a three-dimensional structural view of a horizontal Hall device according to the invention.

In the figures: 1, substrate of first conduction type; 2, BOX layer; 3, epitaxial layer of first conduction type; 4, DTI isolation structure; 5, current barrier layer; 6, well layer of second conduction type; 7, STI layer; 8, heavily doped contact layer of second conduction type; 9, heavily doped contact layer of first conduction type; 91 and 92, a pair of induction electrodes; 93 and 94, a pair of bias electrodes; 100, ground electrode.

DETAILED DESCRIPTION OF THE EMBODIMENTS

The embodiments of the invention will be described in further detail below with reference to the accompanying drawings. Although some embodiments of the invention are shown in the accompanying drawings, it should be understood that the invention can be implemented in various forms and should be limited to the embodiments expounded here. The following embodiments are provided for a more thorough and complete understanding of the invention. It should be understood that the accompanying drawings and embodiments are merely used for an illustrative purpose and are not intended to limit the protection scope of the invention.

It should be understood that steps recorded in the embodiments of the invention can be performed in different orders and/or be performed concurrently. In addition, the embodiments of the method may include other steps and/or omit some steps listed. The scope of the invention will not be limited in this aspect.

The term "include" and its variants used here indicate non-exclusive inclusion, that is, "include, but not limited to". The term "based on" refers to "at least partially based on". The term "one embodiment" indicates "at least one embodiment". The term "another embodiment" indicates "at least one another embodiment". The term "some embodiments" indicates "at least some embodiments". Related definitions of other terms will be given in the following description.

It should be noted that "one" and "multiple" involved in the invention are illustrative rather than restrictive. Those skilled in the art should understand that, unless otherwise expressly stated in the context, "one" should be construed as "one or more", and "multiple" should be construed as "two or more".

Embodiment 1

A horizontal Hall device includes a substrate layer 1 of a first conduction type, a BOX layer 2 is arranged on the substrate layer 1 of the first conduction type, an epitaxial layer 3 of the first conduction type is arranged on the BOX layer 2, a well layer 6 of a second conduction type is arranged on the epitaxial layer 3 of the first conduction type, an STI layer 7 is arranged on the well layer 6 of the second conduction type, a pair of induction electrodes 91 and 92 of the second conduction type and a pair of bias electrodes 93 and 94 of the second conduction type are arranged on the STI layer 7, the pair of induction electrodes 91 and 92 of the second conduction type and the pair of bias electrodes 93 and 94 of the second conduction type are as deep as the well layer 6 of the second conduction type, and ground electrodes 100 are connected to the epitaxial layer 3 of the first conduction type; wherein, current barrier layers 5 are arranged between the induction electrodes of the second conduction type and the adjacent bias electrodes of the second conduction type, and the current barrier layers 5 from the STI layer 7 pass through the well layer 6 of the second conduction type and the epitaxial layer 3 of the first conduction type to be in contact with the BOX layer 2. In this embodiment, the current barrier layers 5 extend outward to edges of the epitaxial layer 3 of the first conduction type, the well layer 6 of the second conduction type and the STI layer 7;

an isolation structure 4 is arranged on the BOX layer 2 and located outside the epitaxial layer 3 of the first conduction type, the well layer 6 of the second conduction type, the STI layer 7 and the current barrier layers 5, and encircles the epitaxial layer 3 of the first conduction type, the well layer 6 of the second conduction type, the STI layer 7 and the current barrier layers 5;

the isolation structure 4 is a DTI structure, and the current barrier layers 5 are DTI regions.

In this embodiment, the first conduction type is a p type, and the second conduction type is an n type; or, in this embodiment, the first conduction type is an n type, and the second conduction type is a p type.

Embodiment 2

A preparation method for a horizontal Hall device includes:

a substrate with a BOX layer and an epitaxial layer is prepared, wherein the epitaxial layer is of a first conduction type, and the substrate is of a first conduction type;

deep trench etching is performed on the epitaxial layer of the first conduction type to form deep trenches, which are located in the BOX layer and have bottoms in direct contact with the BOX layer, and silicon dioxide is deposited to fill in the deep trenches to form current barrier layers 5;

a doping window uncovered with a photoresist is formed by lithography, the current barrier layers 5 are covered with the photoresist, and the top of the epitaxial layer of the first conduction type is doped to form a well layer 6 of a second conduction type;

shallow trench etching is performed on the well layer 6 of the second conduction type except for the current barrier layers 5, induction electrode pair regions and bias electrode pair regions to form a shallow trench located in the well layer of the second conduction type, and silicon dioxide is deposited to form an STI layer; and the induction electrode pair regions and the bias electrode pair regions are doped to form heavily doped contact layers 8 of the second conduction type, and the epitaxial layer of the first conduction type is doped to form heavily doped contact layers 9 of the first conduction type.

In this embodiment, when deep trench etching is performed on the epitaxial layer of the first conduction type, the epitaxial layer of the first conduction type is etched to form a square deep trench located in the BOX layer, and silicon dioxide is deposited to fill in the square deep trench to form an isolation structure 4, wherein the isolation structure 4 encircles the current barrier layer 5, the heavily doped contact layers 8 of the second conduction type, the STI layer 7, and the well layer 6 of the second conduction type and the epitaxial layer of the first conduction type below the STI layer 7, and the epitaxial layer of the first conduction type at corners of the isolation layer 4 is uncovered by the surface of the isolation structure 4.

Embodiment 1 of the invention is described in further detail below with reference to the accompanying drawings.

Figure 2:
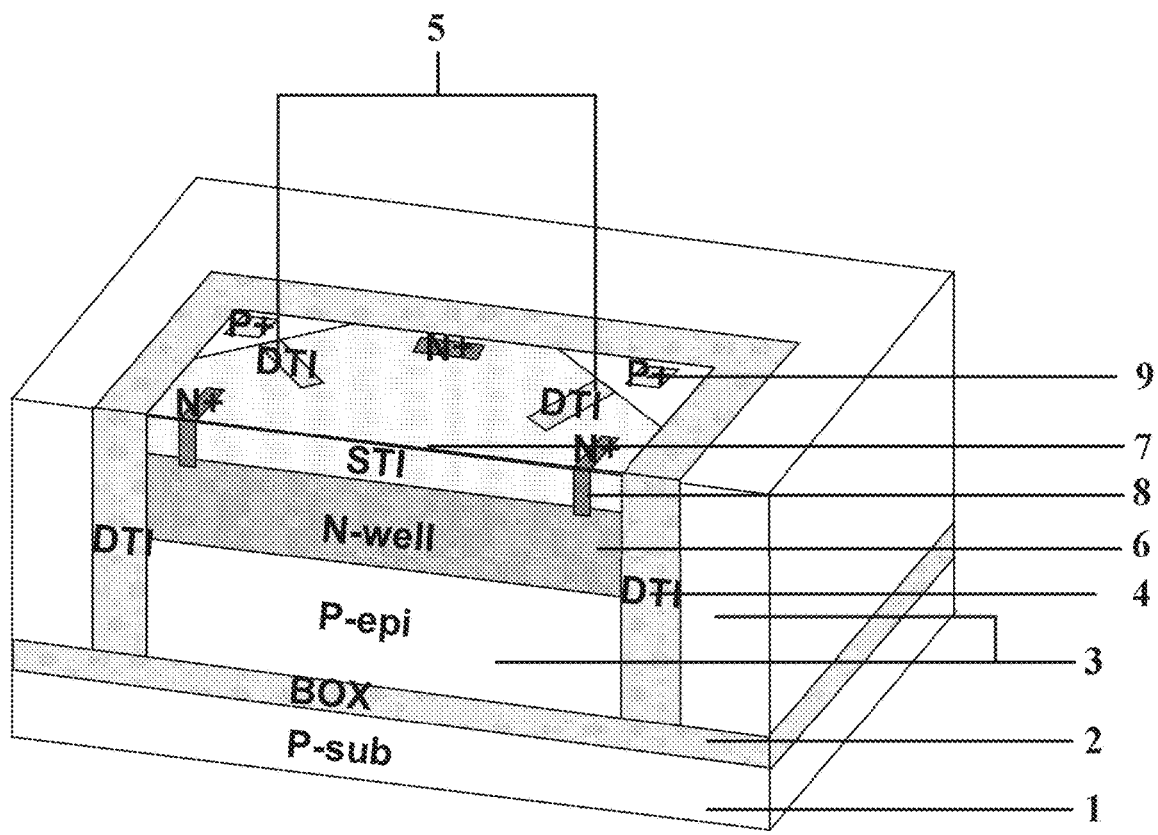
FIG. 2 is a sectional view along $A_1$-$A_1'$ of the horizontal Hall device in FIG. 1 according to the invention.
Figure 3:
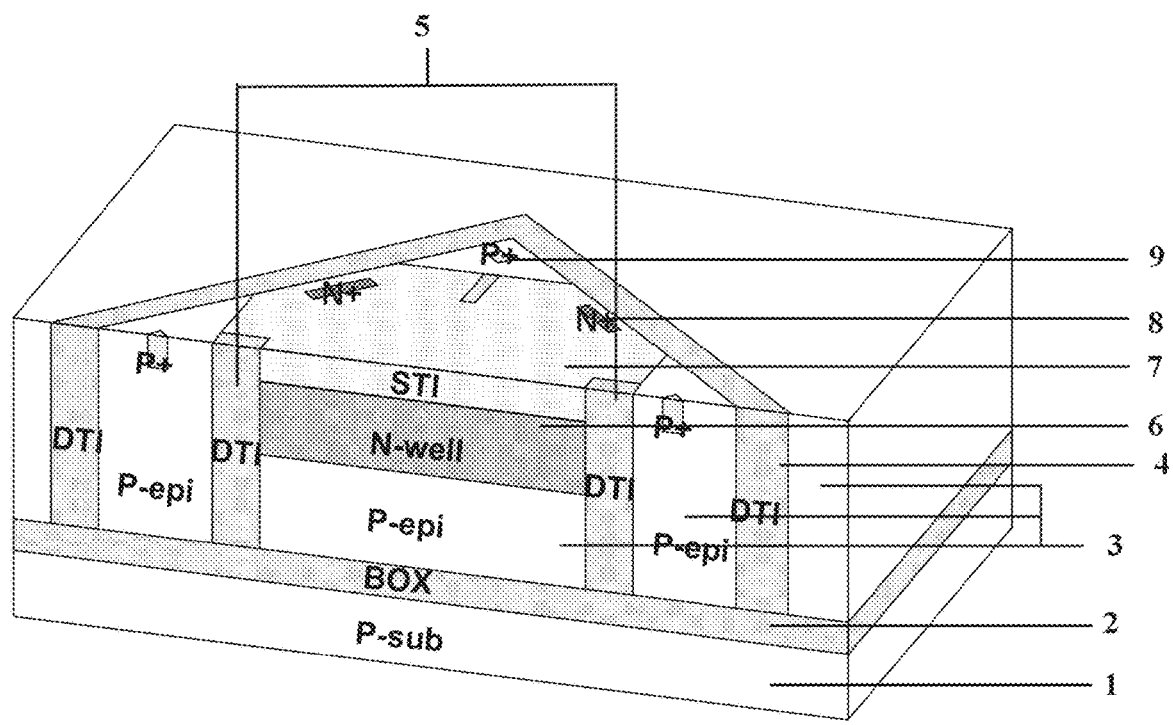
FIG. 3 is a sectional view along $B_1$-$B_1'$ of the horizontal Hall device in FIG. 1 according to the invention.

Referring to FIG. 1, a BOX layer 2 is arranged on a substrate layer 1 of a first conduction type, and an epitaxial layer 3 of the first conduction type is arranged on the BOX layer; referring to FIG. 2 and FIG. 3, deep trench etching is performed on the epitaxial layer of the first conduction type to form a square deep trench and four strip-shaped deep trenches located in the BOX layer 2, silicon dioxide is deposited in the square deep trench and the four strip-shaped deep trenches respectively to form an isolation structure 4 and current barrier layers 5, and the current barrier layers 5 may be DTI structures to completely cut off the current and isolate the device by increasing the resistance to block or even cut off the electron flow path; a regular octagonal window is arranged on the epitaxial layer 3 of the first conduction type, four spaced edges of the regular octagonal window coincide with four edges of the isolation structure 4, and the four current barrier layers 5 are located on the other four spaced edges of the regular octagonal window respectively; the region in the regular octagonal window except for the current barrier layers 5 is doped to form a well layer 6 of a second conduction type, the well layer 6 of the second conduction type is etched to remove the well layer 6 of the second conduction type from the surface except regions where a pair of induction electrodes and a pair of bias electrodes are to be formed, and then silicon dioxide is deposited on the well layer 6 of the second conduction type to form an STI layer 7; next, the well layer of the second conduction type where the pair of induction electrodes and the pair of bias electrodes are to be formed is doped to form heavily doped contact layers 8 of the second conduction type, the epitaxial layer of the first conduction type at corners of the isolation structure 4 is doped to form heavily doped contact layers 9 of the first conduction type; and finally, the epitaxial layer is covered with a dielectric layer, holes are formed in the dielectric layer, metal is deposited in the holes to form a pair of induction electrodes 91 and 92 and a pair of bias electrodes 93 and 94 connected to the heavily doped contact layers 8 of the second conduction type, and ground electrodes 100 connected to the heavily doped contact layers 9 of the first conduction type.

Referring to FIG. 1, the isolation structure 4 is square, the current barrier layers 5 are arranged in a cavity of the isolation structure 4, located on diagonals of the square isolation structure 4, and perpendicularly symmetric with each other; the cross-section of the current barrier layers 5 and the cross-section of the heavily doped contact layers 8 of the second conduction type are both rectangular, wherein the length of the current barrier layers 4 is not greater than 30 μm, the width of the current barrier layers 4 is not greater than 1.5 μm, the length of the heavily doped contact layers 8 of the second conduction type is not less than one-tenth of the side length of the STI layer, and the width of the heavily doped contact layers 8 of the second conduction type is not greater than 1.5 μm. The distance between the heavily doped contact layers 8 of the second conduction type and edges of the adjacent octagonal N-well layer is greater than 0.5 μm. Referring to FIG. 2 or FIG. 3, the maximum depth of the STI layer 7 is less than 5 μm.

The induction electrodes 91 and 92 of the second conduction type are distributed symmetrically, and the bias electrodes 93 and 94 of the second conduction type are distributed symmetrically. In the operating state, the pair of induction electrodes 91 and 92 is used for inputting and outputting bias electric signals, and the pair of bias electrodes 93 and 94 of the second conduction type is used for outputting induction electric signals.

Figure 5:
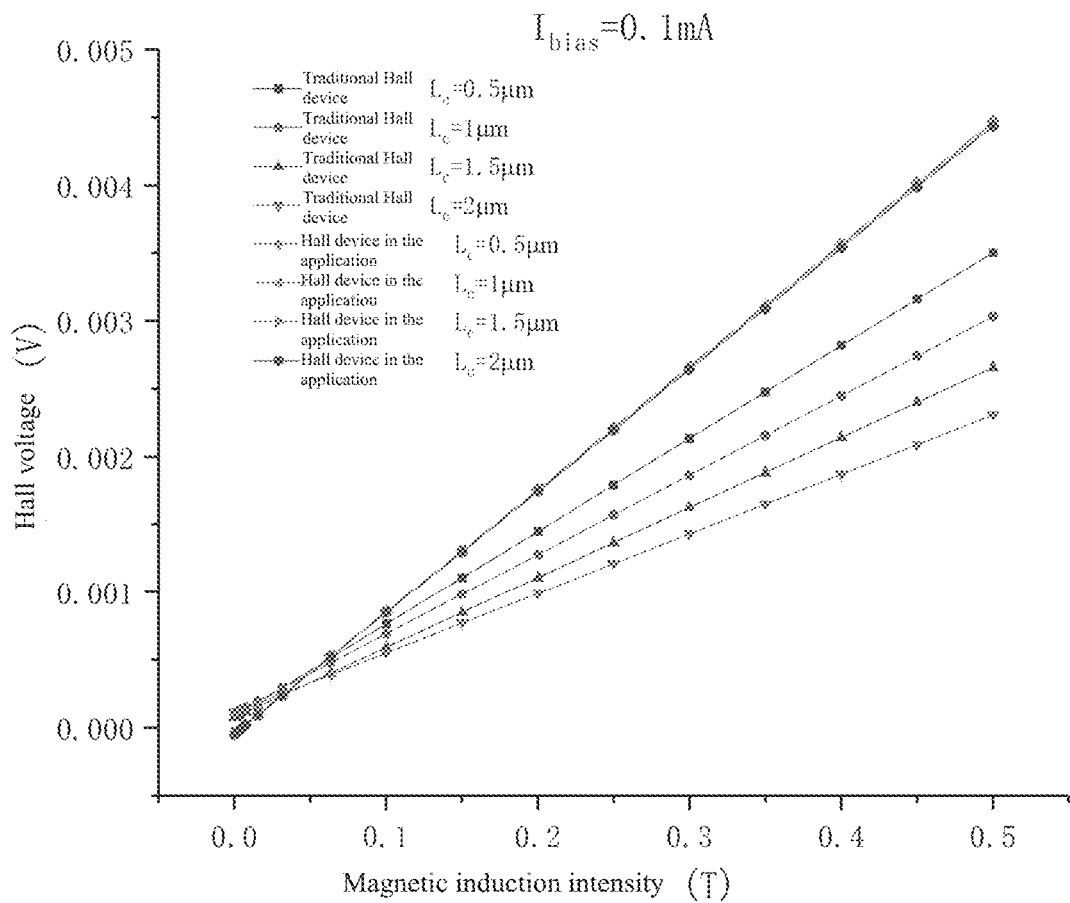
FIG. 5 illustrates Hall voltage output curves of the horizontal Hall device according to the invention and the traditional Hall device.

FIGS. 4A-4B illustrate schematic diagrams of current density distributions of the horizontal Hall device in FIG. 1 according to the invention and a traditional Hall device, from an overhead view. As shown in FIG. 4B, in the traditional Hall device, the current tends to flow in a low-resistance direction, and part of the current directly flows to an adjacent electrode along a shortest path on the surface of the device, such that the sensitivity is reduced, that is, "short-circuiting" occurs. As shown in FIG. 4A, length-controllable current barrier layers 5 arranged in the cavity of the horizontal Hall device provided by the invention change the resistance distribution in the device, the original low-resistance current path is turned into a high-resistance path, the current will not flow anymore along the "short-circuiting" path, and the part of current that originally flows along the "short-circuiting" path generates a Hall voltage in a direction perpendicular to the current flow direction under the action of magnetic field force. As shown in FIG. 5, compared with the traditional Hall device, the Hall voltage of the horizontal Hall device in the invention is increased by 92%, the sensitivity of the Hall device is improved, and "short-circuiting" restricting the improvement of the sensitivity of the Hall device is avoided.

As shown in FIG. 5 which illustrates Hall voltage output curves of the horizontal Hall device in FIG. 1 according to the invention and the traditional Hall device, under different electrode sizes $L_e$, the Hall voltage of the horizontal Hall device in the invention is increased by 92% to the maximum extent, as compared with the in FIG. 1 Hall device; when the electrode size changes, the Hall voltage of the horizontal Hall device in the invention hardly changes, while the Hall voltage of the traditional Hall device changes greatly. This indicates that the sensitivity of the Hall device in the invention will not be restrained by the geometric factor in traditional theory by controlling the current path, such that the influence of the electrode size on the sensitivity of the device is avoided, and the electrode size can be increased to reduce the offset without compromising the sensitivity of the device.

Figure 6:
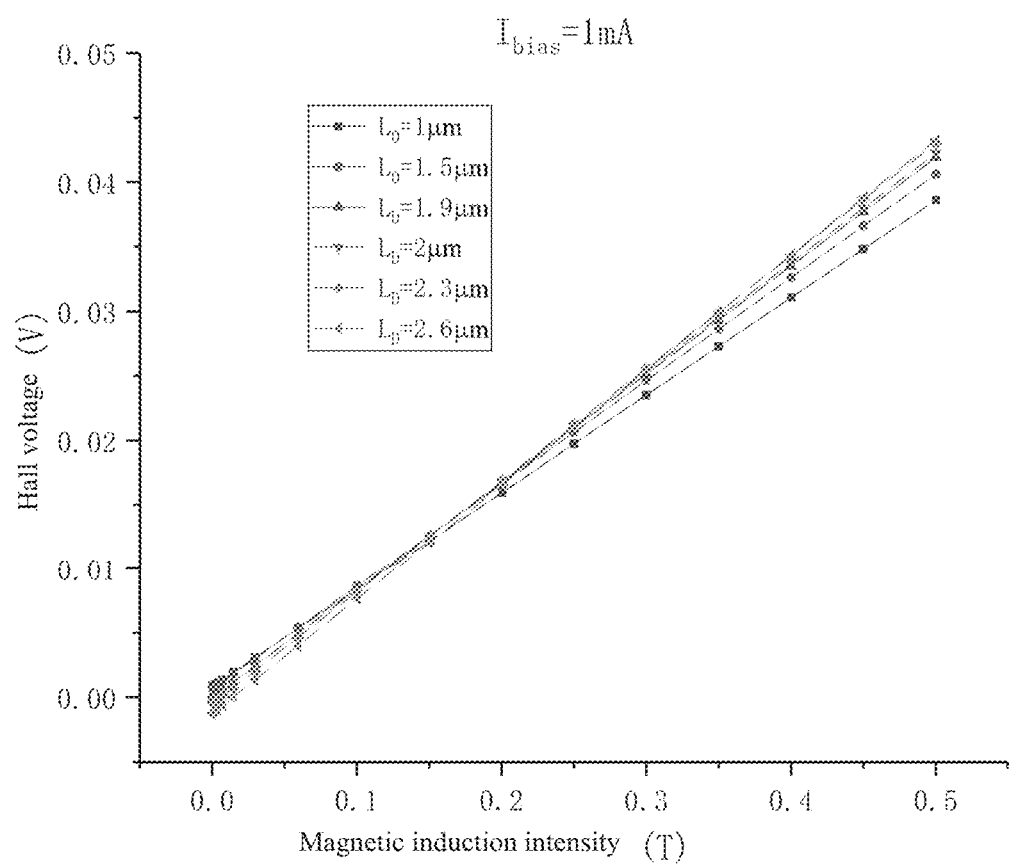
FIG. 6 illustrates Hall voltage output curves of the horizontal Hall device according to the invention.

As shown in FIG. 6 which illustrates Hall voltage output curves of the horizontal Hall device according to the invention, with the increase of the length $L_D$ of the current barrier layers 5, the Hall voltage of the horizontal Hall device in the invention increases accordingly, indicating that the sensitivity of the Hall device in the invention can be controlled by adjusting by the length of the current barrier layers 5.

FIGS. 7A-7L show a flow diagram of the preparation of a horizontal Hall device according to the invention. The preparation method for a horizontal Hall device provided by the invention will be described in detail below with reference to FIGS. 7A-7L.

Figure 7A:
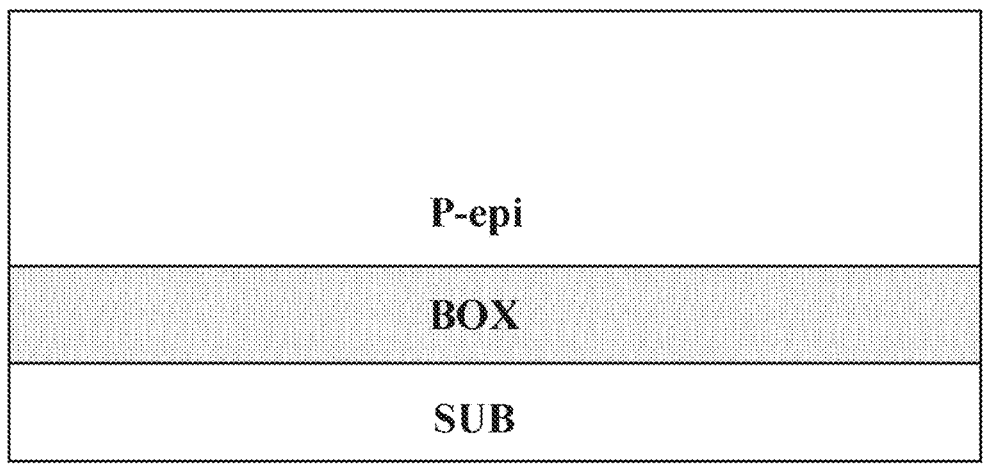
FIGS. 7A-7L show a flow diagram of the preparation of a horizontal Hall device according to the invention.

As shown in FIG. 7A, a P-type substrate formed with a BOX layer and a P-type epitaxial layer is obtained by wafer bonding.

Figure 7B:
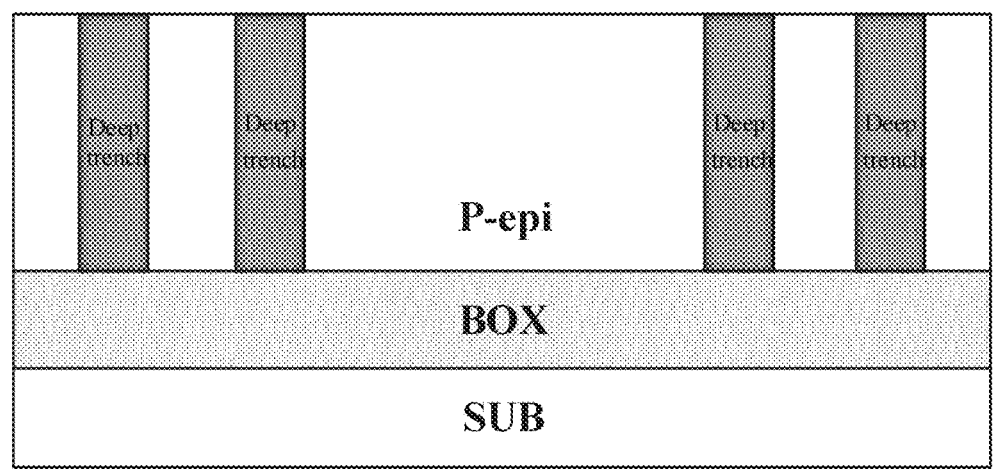

As shown in FIG. 7B, deep trench etching is performed on the P-type epitaxial layer by dry etching to form deep trenches of a specific shape, wherein the deep trenches are located in the BOX layer, and the bottoms of the deep trenches are in direct contact with the BOX layer.

Figure 7C:
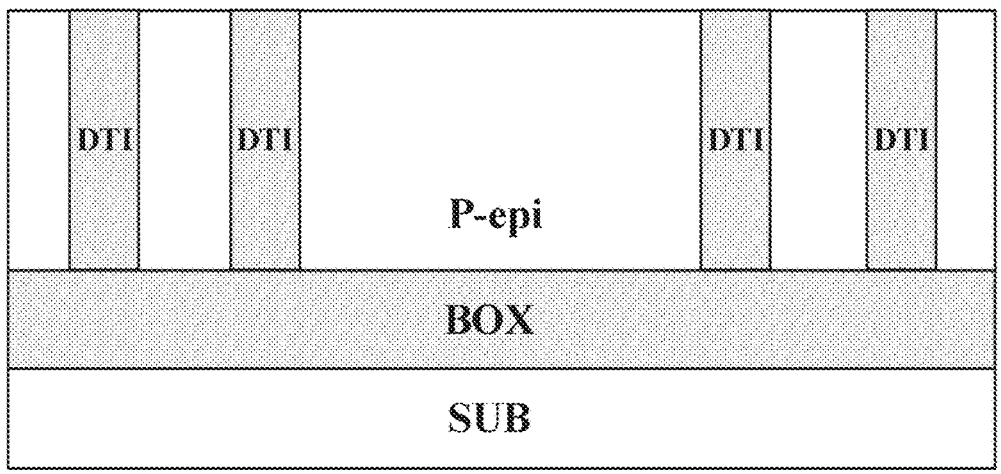

As shown in FIG. 7C, silicon dioxide is deposited in the deep trenches by chemical vapor deposition to fill in the deep trenches to form DTI structures.

Figure 7D:
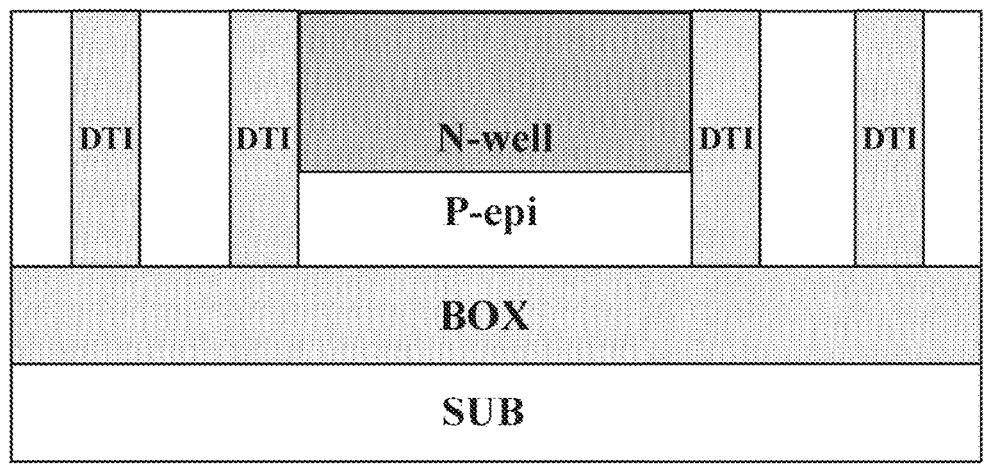

As shown in FIG. 7D, high-energy N-type ions are implanted into the P-type epitaxial layer 3 to form a shallow N-well layer.

Figure 7E:
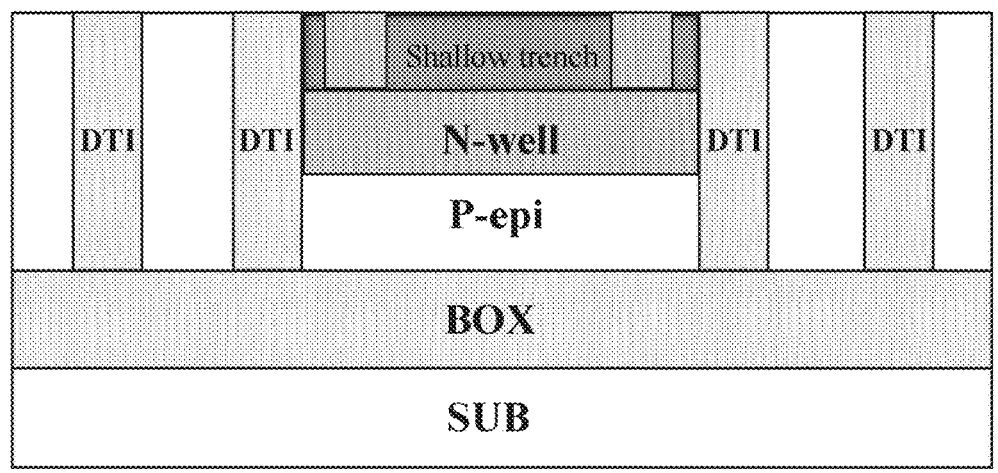

As shown in FIG. 7E, shallow trench etching is performed on the shallow N-well layer by dry etching.

Figure 7F:
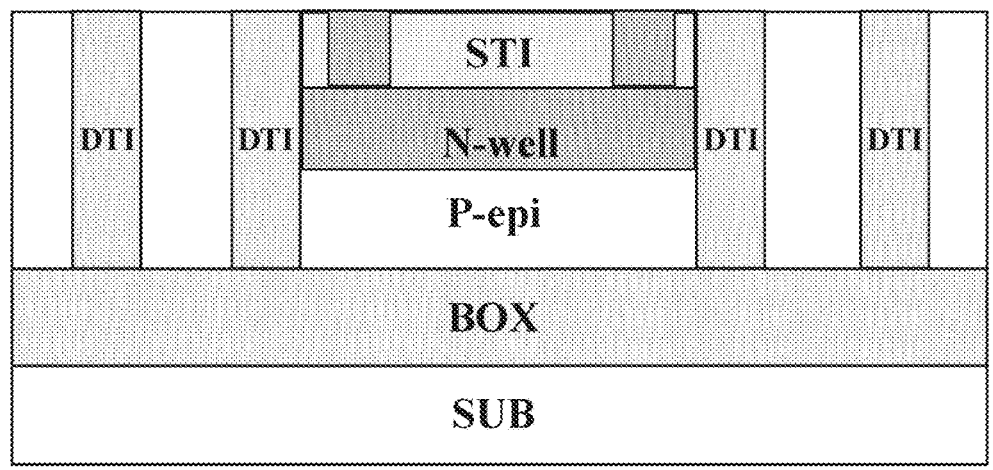

As shown in FIG. 7F, silicon dioxide is deposited in a shallow trench by chemical vapor deposition to form an STI layer.

Figure 7G:
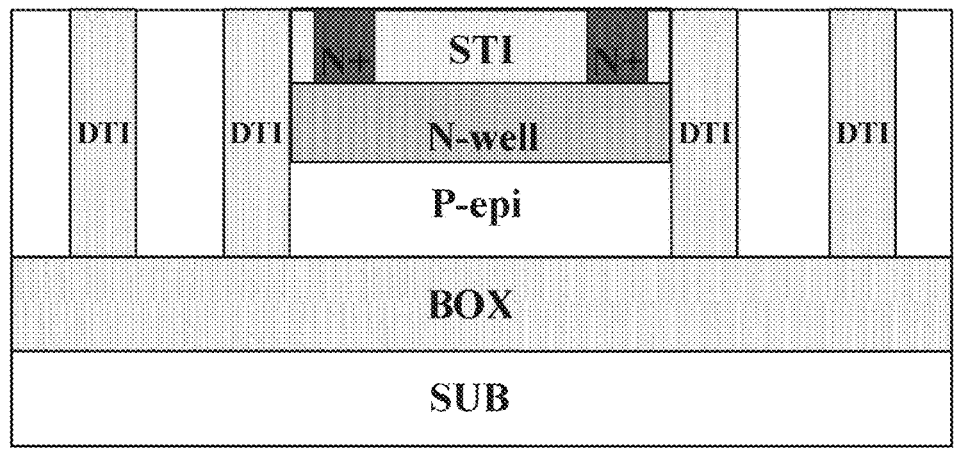

As shown in FIG. 7G, high-energy N-type ions are implanted into the shallow N-well layer to form N+ contact layers.

Figure 7H:
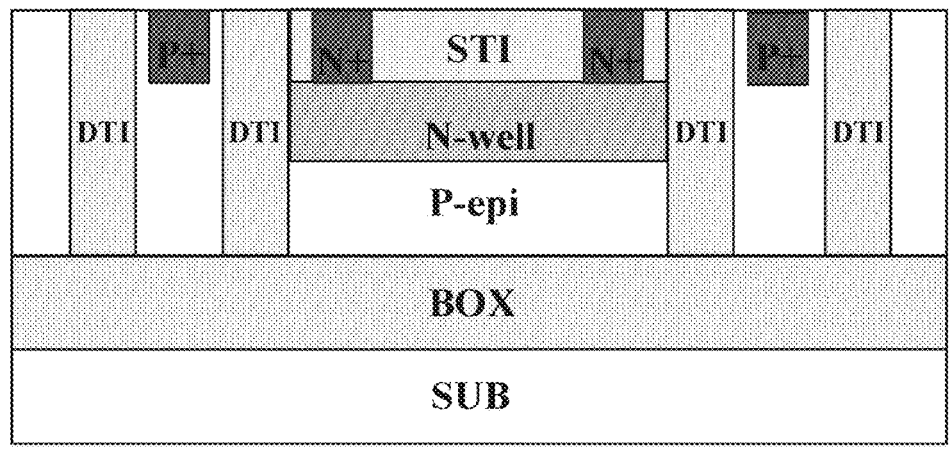

As shown in FIG. 7H, high-energy P-type ions are implanted into the P-type epitaxial layer 3 to form P+ contact layers.

Figure 7I:
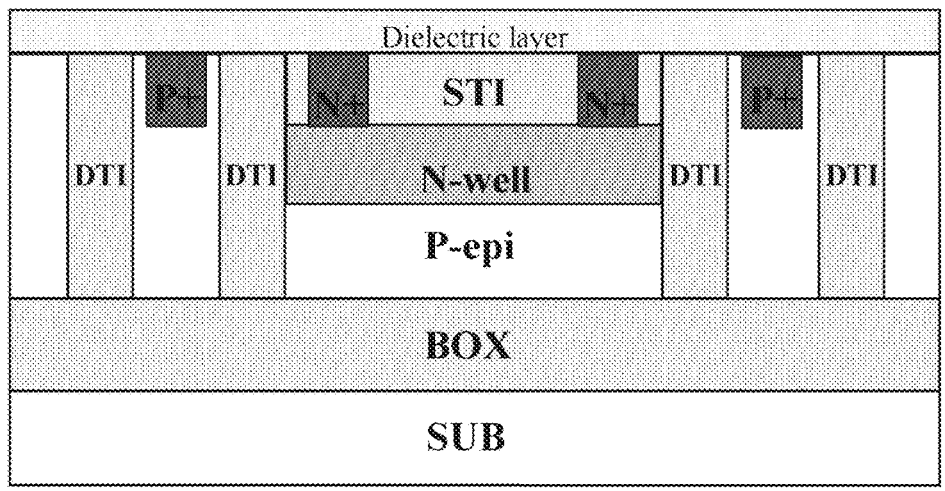

As shown in FIG. 7I, a dielectric layer is deposited on the P-type epitaxial layer 3.

Figure 7J:
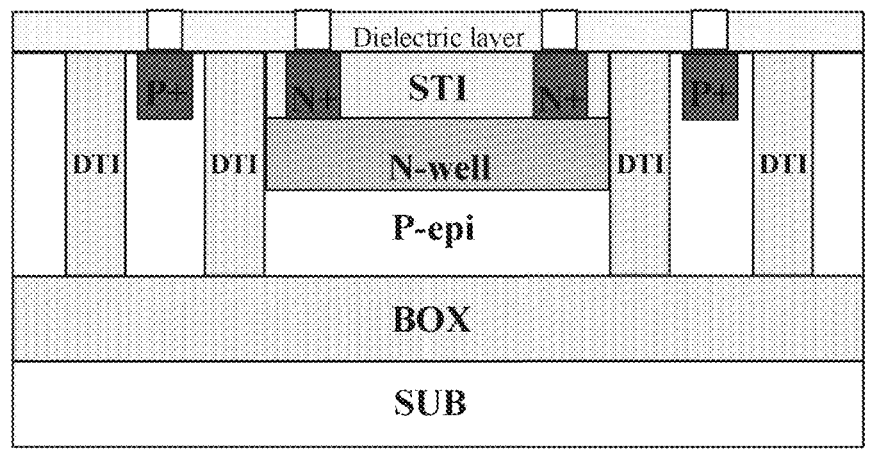

As shown in FIG. 7J, holes are formed in the dielectric layer above the N+ contact layers and the P+ contact layers.

Figure 7K:
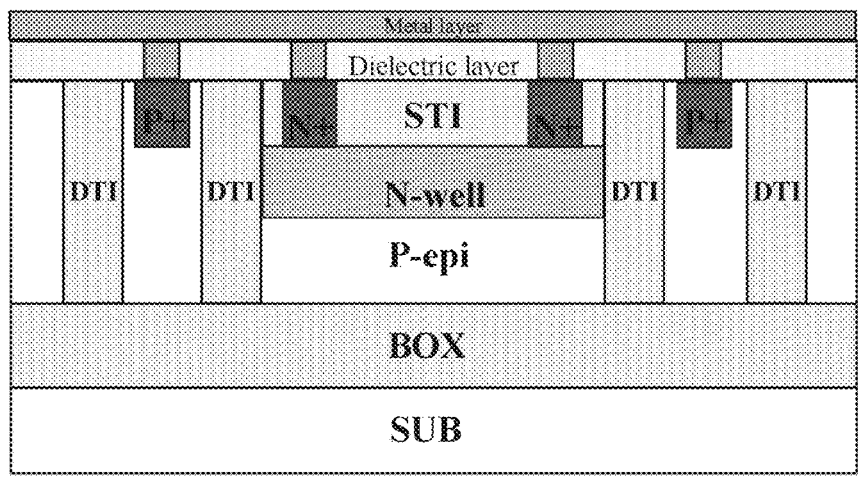

As shown in FIG. 7K, a metal layer is deposited on the dielectric layer.

Figure 7L:
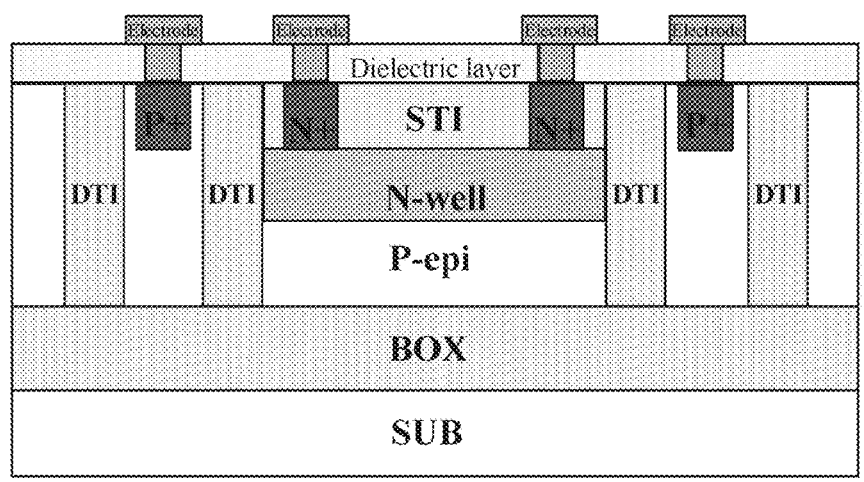

As shown in FIG. 7L, lithography and etching are performed on the metal layer to form metal electrodes on the N+ contact layers and the P+ contact layers.

Finally, it should be noted that although the invention is described in detail with reference to embodiments, those skilled in the art can still make modifications to the technical solutions in the embodiments described above or make equivalent substitutions to part of the technical features in these embodiments, and any modifications, equivalent substitutions and improvements made based on the spirit and principle of the invention should also fall within the protection scope of the invention.

What is claimed is:

1. A horizontal Hall device, comprising a substrate layer of a first conduction type, a buried oxide (BOX) layer being arranged on the substrate layer of the first conduction type, an epitaxial layer of the first conduction type being arranged on the BOX layer, a well layer of a second conduction type being arranged on the epitaxial layer of the first conduction type, a shallow trench isolation (STI) layer being arranged on the well layer of the second conduction type, a pair of induction electrodes of the second conduction type and a pair of bias electrodes of the second conduction type being arranged on the STI layer, the pair of induction electrodes of the second conduction type and the pair of bias electrodes of the second conduction type being as deep as the well layer of the second conduction type, ground electrodes being connected to the epitaxial layer of the first conduction type, wherein current barrier layers are arranged between the induction electrodes of the second conduction type and the adjacent bias electrodes of the second conduction type, and the current barrier layers from the STI layer pass through the well layer of the second conduction type and the epitaxial layer of the first conduction type to be in contact with the BOX layer.

2. The horizontal Hall device according to claim 1, wherein the current barrier layers extend outward to edges of the epitaxial layer of the first conduction type, the well layer of the second conduction type and the STI layer.

3. The horizontal Hall device according to claim 2, wherein an isolation structure is arranged on the BOX layer and located outside the epitaxial layer of the first conduction type, the well layer of the second conduction type, the STI layer and the current barrier layers, and encircles the epitaxial layer of the first conduction type, the well layer of the second conduction type, the STI layer and the current barrier layers.

4. The horizontal Hall device according to claim 3, wherein the isolation structure is a DTI structure.

5. The horizontal Hall device according to claim 2, wherein the current barrier layers are DTI regions.

6. The horizontal Hall device according to claim 1, wherein an isolation structure is arranged on the BOX layer and located outside the epitaxial layer of the first conduction type, the well layer of the second conduction type, the STI layer and the current barrier layers, and encircles the epitaxial layer of the first conduction type, the well layer of the second conduction type, the STI layer and the current barrier layers.

7. The horizontal Hall device according to claim 6, wherein the isolation structure is a deep trench isolation (DTI) structure.

8. The horizontal Hall device according to claim 1, wherein the current barrier layers are DTI regions.

9. The horizontal Hall device according to claim 1, wherein the first conduction type is a p type, and the second conduction type is an n type.

10. The horizontal Hall device according to claim 1, wherein the first conduction type is an n type, and the second conduction type is a p type.

11. The horizontal Hall device according to claim 1, wherein a connecting line of induction electrodes in the pair of induction electrodes of the second conduction type is perpendicular to a connecting line of bias electrodes in the pair of bias electrodes of the second conduction type.

12. A preparation method for a horizontal Hall device, comprising
  preparing a substrate with a BOX layer and an epitaxial layer, wherein the epitaxial layer is of a first conduction type, and the substrate is of the first conduction type;
  performing deep trench etching on the epitaxial layer of the first conduction type to form deep trenches, wherein the deep trenches are located in the BOX layer and have bottoms in direct contact with the BOX layer, and depositing silicon dioxide to fill in the deep trenches to form current barrier layers;
  forming, by lithography, a doping window uncovered with a photoresist, covering the current barrier layers with the photoresist, and doping a top of the epitaxial layer of the first conduction type to form a well layer of a second conduction type;
  performing shallow trench etching on the well layer of the second conduction type except the current barrier layers, induction electrode pair regions and bias electrode pair regions to form a shallow trench located in the well layer of the second conduction type, and depositing silicon dioxide to form an STI layer; and
  doping the induction electrode pair regions and the bias electrode pair regions to form heavily doped contact layers of the second conduction type, and doping the epitaxial layer of the first conduction type to form heavily doped contact layers of the first conduction type.

13. The preparation method for the horizontal Hall device according to claim 12, wherein when deep trench etching is performed on the epitaxial layer of the first conduction type, the epitaxial layer of the first conduction type is etched to form a square deep trench located in the BOX layer, and silicon dioxide is deposited to fill in the square deep trench to form an isolation structure, wherein the isolation structure encircles the current barrier layer, the heavily doped contact layers of the second conduction type, the STI layer, and the well layer of the second conduction type, the epitaxial layer of the first conduction type and the heavily doped contact layers of the first conduction type below the STI layer, and the epitaxial layer of the first conduction type at corners of the isolation layer is uncovered by a surface of the isolation structure.

* * * * *